(12) United States Patent
Rose

(10) Patent No.: US 7,038,864 B2
(45) Date of Patent: May 2, 2006

(54) SLIM PROFILE INDICATING INSTRUMENTS

(76) Inventor: Vincent H. Rose, 155 North Clark St., Powell, WY (US) 82435

( * ) Notice: Subject to any disclaimer, the term of this patent is extended or adjusted under 35 U.S.C. 154(b) by 209 days.

(21) Appl. No.: 10/686,819

(22) Filed: Oct. 15, 2003

(65) Prior Publication Data
US 2004/0085633 A1    May 6, 2004

Related U.S. Application Data

(62) Division of application No. 09/912,196, filed on Jul. 23, 2001, now Pat. No. 6,710,718.

(60) Provisional application No. 60/220,456, filed on Jul. 24, 2000.

(51) Int. Cl.
*G02B 7/02*    (2006.01)
(52) U.S. Cl. ............... 359/819; 359/822; 359/642
(58) Field of Classification Search ............ 359/642, 359/819–824
See application file for complete search history.

(56) References Cited

U.S. PATENT DOCUMENTS

| | | | | |
|---|---|---|---|---|
| 4,939,934 A | | 7/1990 | Ritzenthaler et al. | 73/431 |
| 5,142,456 A | | 8/1992 | Murphy | 362/26 |
| 5,298,096 A | * | 3/1994 | Yoshino et al. | 156/64 |
| 5,353,166 A | * | 10/1994 | Hanford et al. | 359/819 |
| 5,852,518 A | * | 12/1998 | Hatasawa et al. | 359/822 |
| 6,144,548 A | | 11/2000 | Kerchaert | 361/659 |
| 6,445,516 B1 | * | 9/2002 | Osterried | 359/819 |
| 6,574,053 B1 | * | 6/2003 | Spinali | 359/819 |
| 6,590,721 B1 | * | 7/2003 | Onda | 359/819 |

* cited by examiner

*Primary Examiner*—Ricky L. Mack
*Assistant Examiner*—M. Hasan
(74) *Attorney, Agent, or Firm*—Hensley Kim & Edgington, LLC

(57) ABSTRACT

The present invention concerns the structure of and methods of constructing indicating instruments with slim profiles. The indicating instrument comprises a meter movement and a circuit board. The main body of the meter movement is situated in an aperture in the circuit board. With this placement, the front end of the body of the meter movement extends a distance in front of the circuit board and the back end of the meter movement body extends a distance behind the circuit board. Through appropriate selection and arrangement of any components on the circuit board, the circuit board can be constructed such that none of its components extend beyond the distance that the meter movement extends on either side of the circuit board. In this manner the space needed for the meter movement and the circuit board and its components collapses into the same area. A light plate may be added to the circuit board and meter movement. The light plate provides a structural framework for the indicating instrument. The circuit board and meter movement may be mounted to the light plate. In this manner, the internal components of the indicating instrument are all held together and can be calibrated and tested without the addition of any further components.

8 Claims, 14 Drawing Sheets

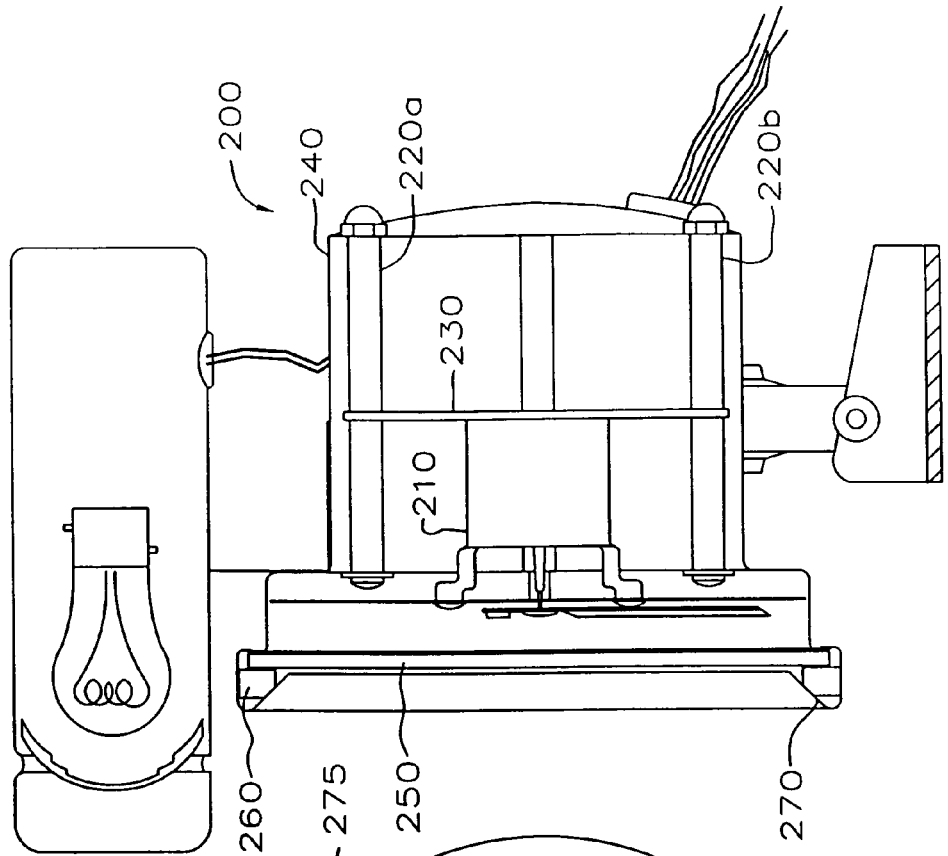
FIG. 1B-PRIOR ART
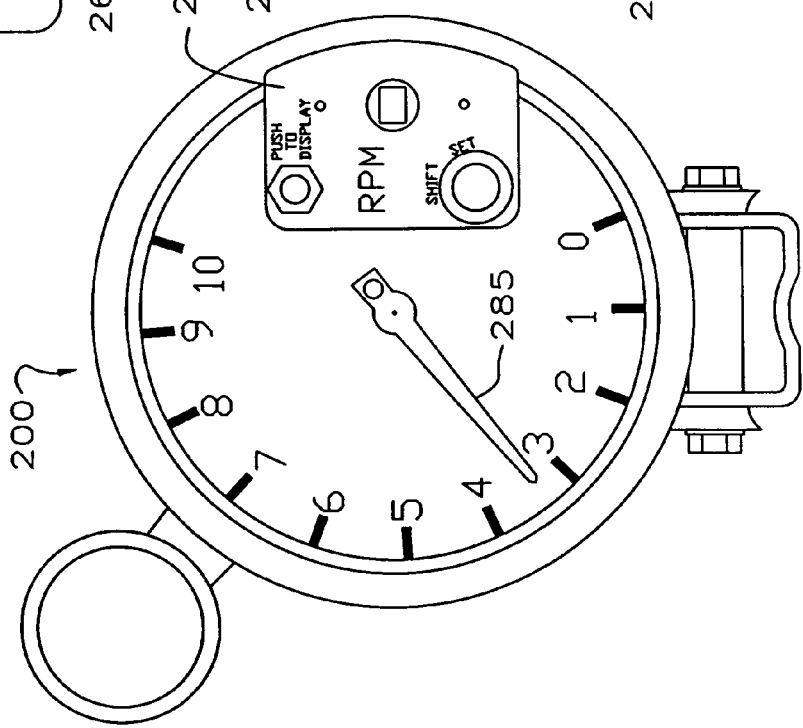
FIG. 1A-PRIOR ART

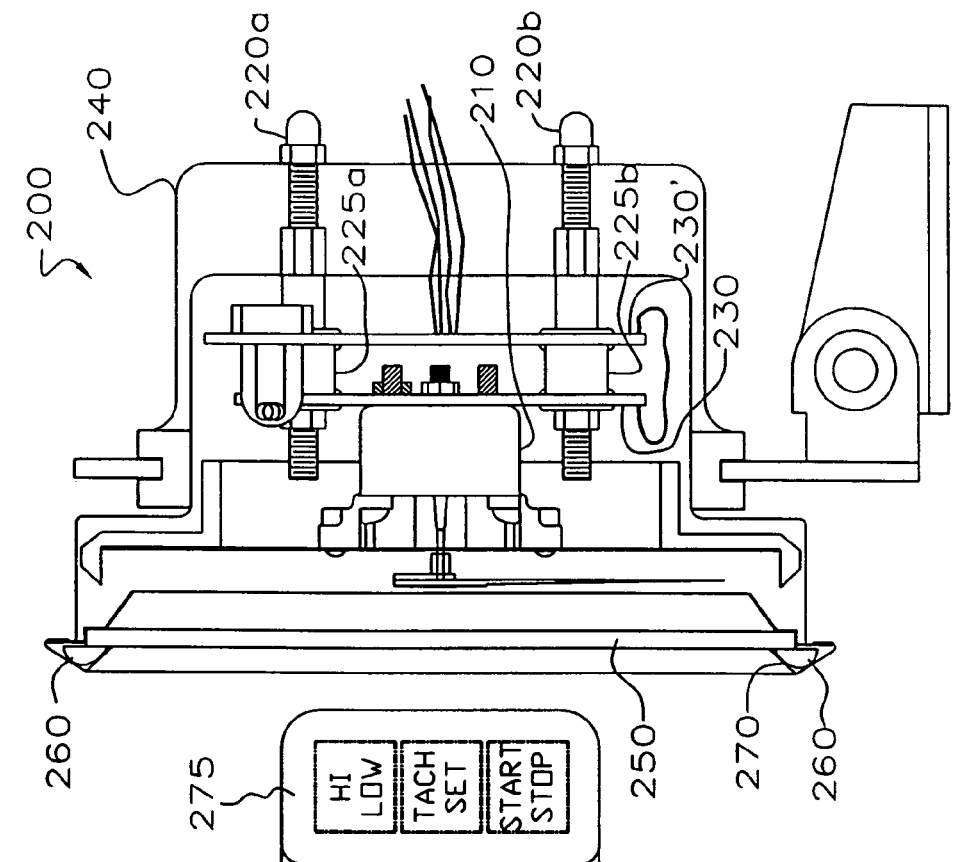
FIG. 2B—PRIOR ART
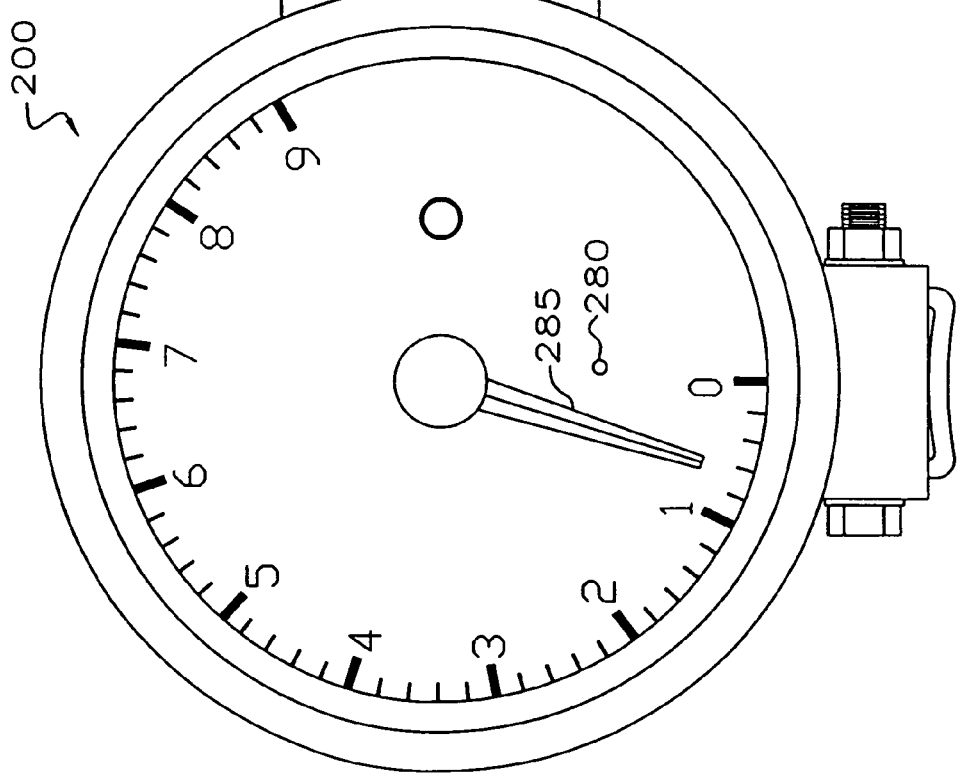
FIG. 2A—PRIOR ART

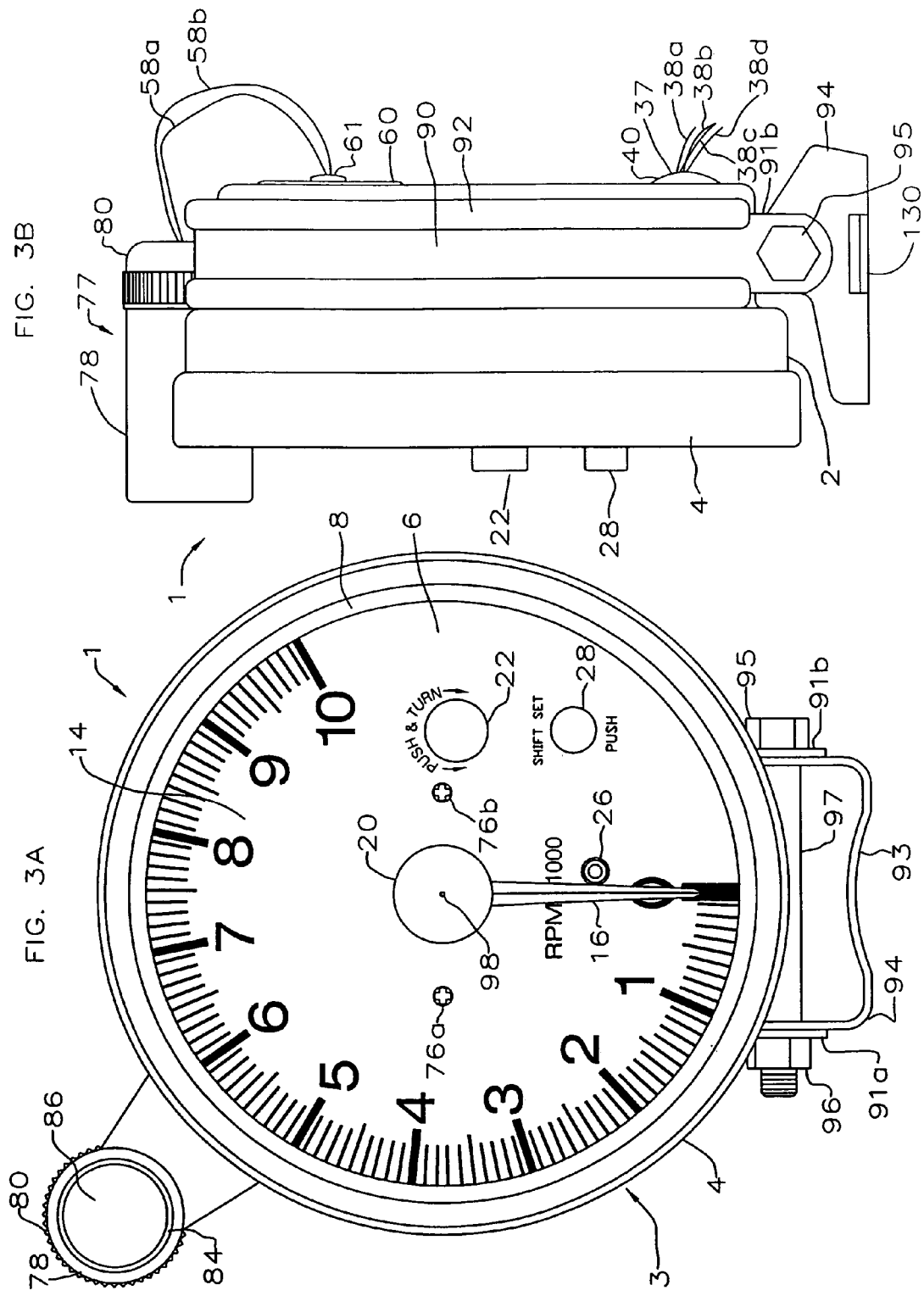

FIG. 9A
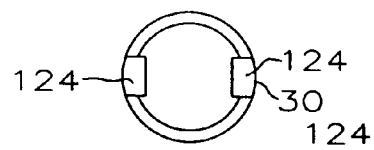
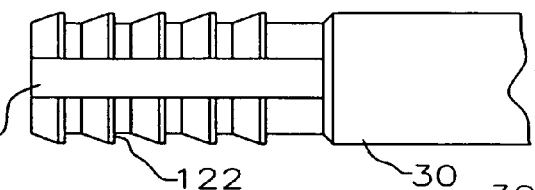
FIG. 9B
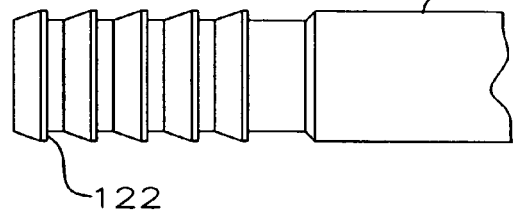
FIG. 9C

FIG. 9F
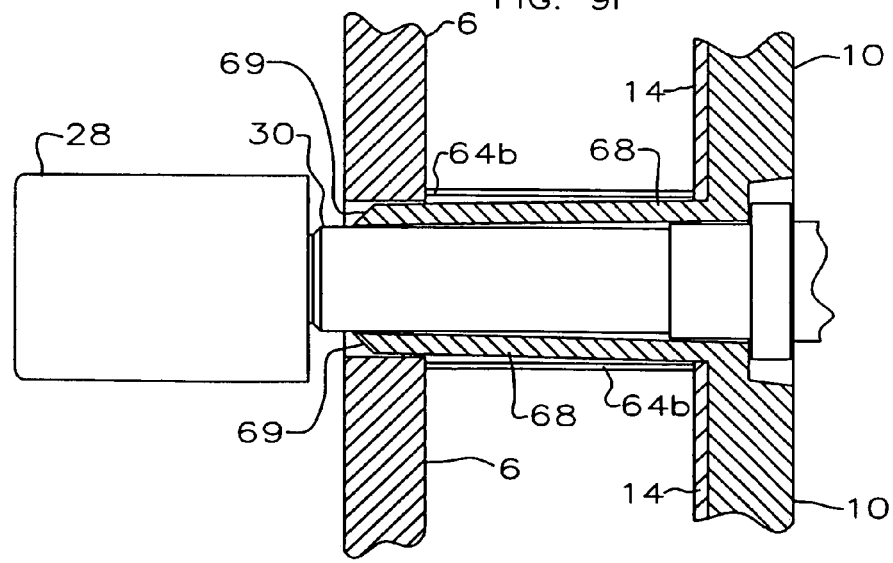

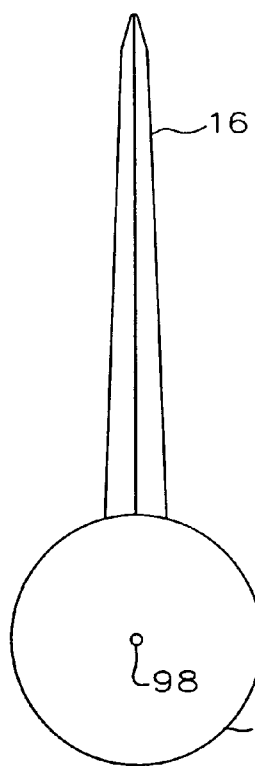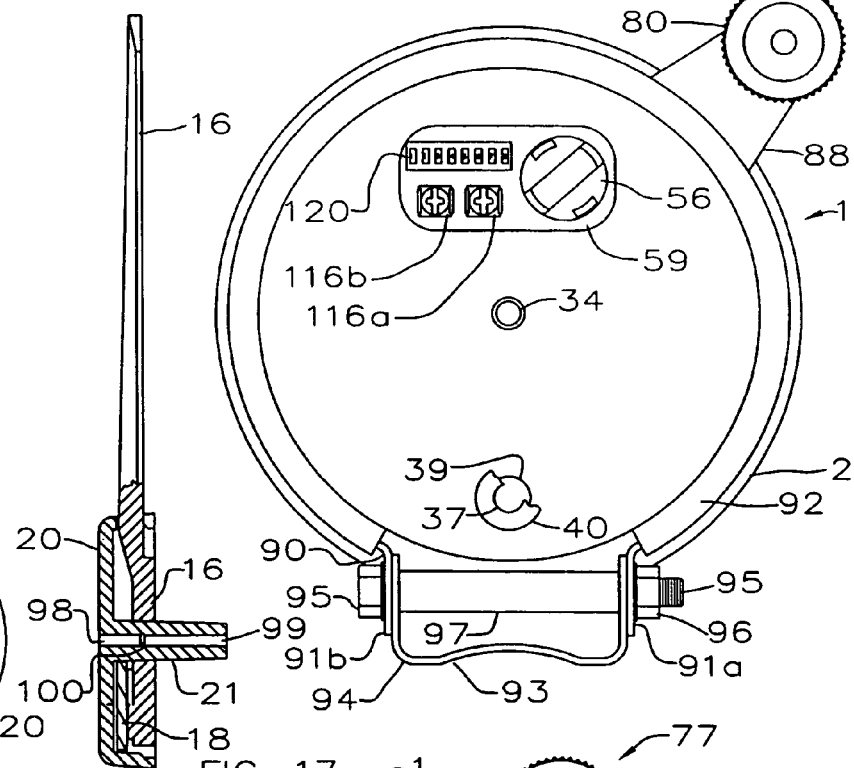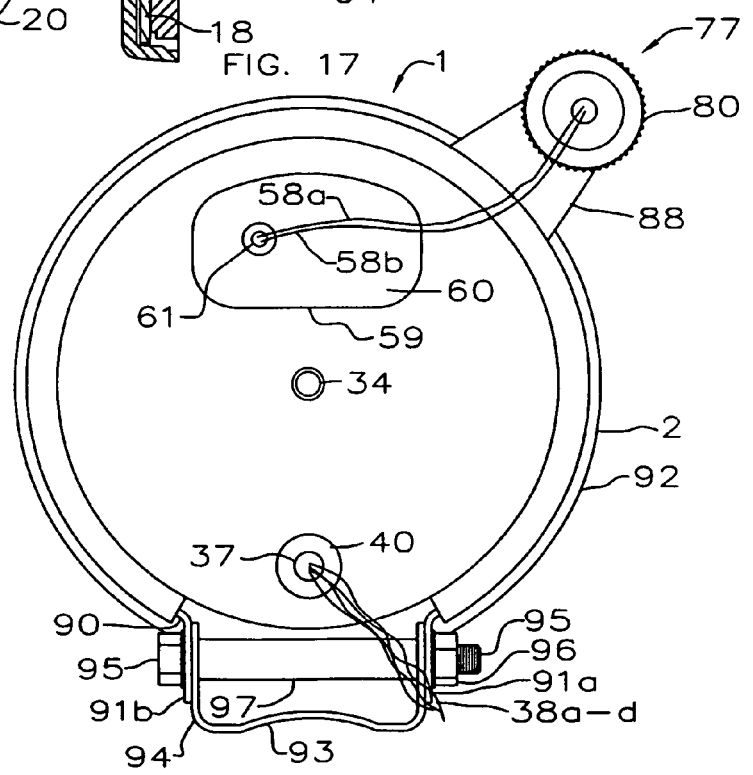

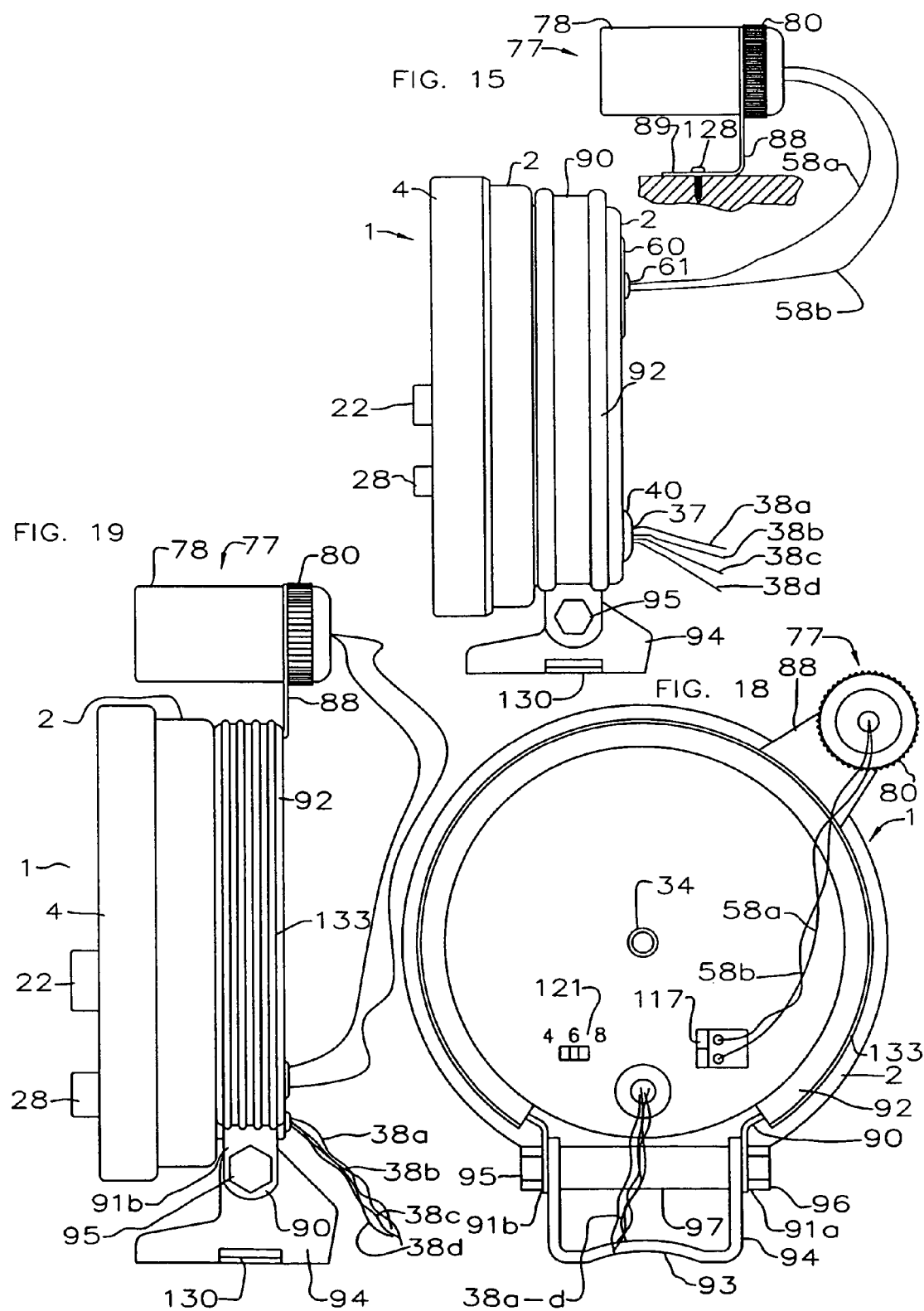

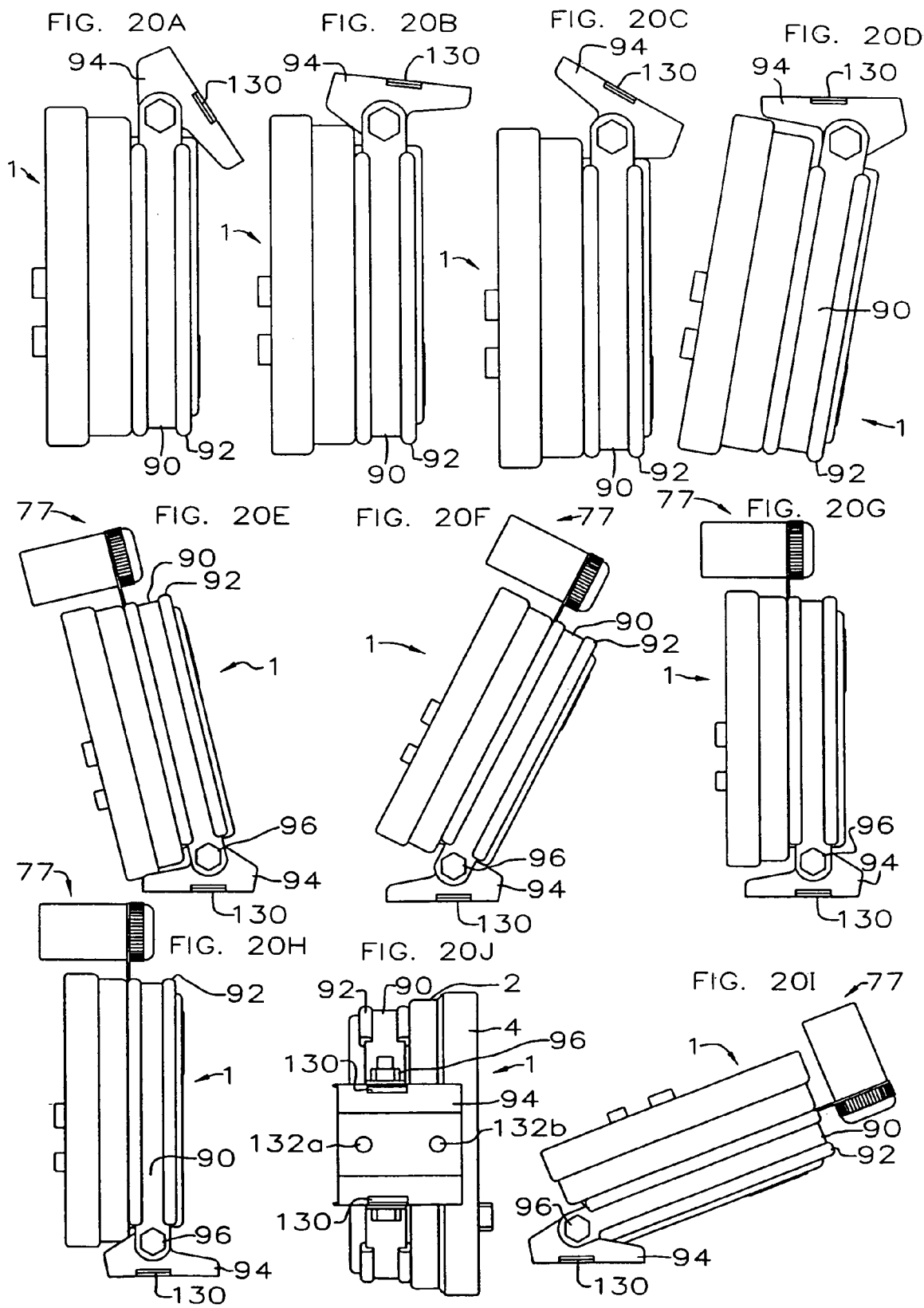

SLIM PROFILE INDICATING INSTRUMENTS

CROSS REFERENCE TO RELATED APPLICATIONS

This application is a divisional of U.S. application Ser. No. 09/912,196 entitled "Slim Profile Indicating Instruments", filed 23 Jul. 2001, now U.S. Pat. No. 6,701,718 which claimed the benefit of U.S. provisional application No. 60/220,456 entitled "Slim Profile Tachometer," filed on 24 Jul. 2000. Each of the above-referenced applications is hereby incorporated by reference as though fully set forth herein.

BACKGROUND OF THE INVENTION

1. Field of the Invention

This invention relates to an indicating instrument assembly of any type and more directly to an assembly structure that decreases the depth required for the instrument assembly.

2. Description of the Related Art

Indicating instruments are used for numerous applications across a variety of industries and within innumerable types of machines, systems, and vehicles. Indicating instruments can, for example, measure the speed of a vehicle, such as an automobile or airplane, or measure the rotational speed of an engine shaft or turbine to indicate a need to switch to an appropriate gear ratio so that the motor is not overworked. Indicating instruments can also be fuel, pressure, and temperature gauges, which are found, for example, on vehicles, heavy equipment, assembly line apparatuses, and other industrial equipment. Complex vehicles and other equipment may have a variety of other special purpose indicating instruments to measure any recordable or gaugable activity or condition. For example, airplanes and submarines may have altitude and depth gauges, respectively.

In many situations it is desirable to construct an indicating instrument as small as possible because of size constraints of the environment in which it is used. For example, in an airplane cockpit a large number of instruments must be placed in an extremely limited area. The size of the indicating instrument is considered not only as a factor of its exposed surface area as viewed by an operator, but also in terms of the amount of space taken, for example, under a mounting surface or behind a panel, by the instrument's functional and mounting components.

In other instances, it is desirable that the exposed portion of the indicating instrument be quite large so that the operator can easily perceive the presentation of the gauged information. In these situations, although it may be desirable to provide a large display for the information, it may be equally desirable that the indicating instrument be otherwise small in size due to similar constraints of space for housing or mounting the underlying functional components. An example of these competing needs may be seen in the dashboard instruments of an automobile such as speedometers and tachometers where the dial size is desired to be large for easy reading, but the mounting and housing space within the dashboard is limited.

Indicating instruments may also be manufactured for sale on the "aftermarket," wherein additional instruments or devices, which were unavailable as options on the vehicle or other equipment at the time of original purchase, are provided for installation by the operator. In the case of aftermarket indicating instruments such as speedometers or tachometers, these gauges may be provided for mounting on top of the dashboard or at another location in the vehicle for ease of viewing by the operator. For example, many aftermarket tachometers are sold to automobile operators involved in stock car racing. In such racing it is important for the operator to know when to shift, but it is imperative that the operator be able to concentrate on the raceway and the competitor vehicles in order to avoid a collision. Many of these racing operators prefer to mount an aftermarket tachometer on top of the dashboard, or otherwise in the area of the windshield, so they do not have to lower their eyes from the road to read an original equipment tachometer mounted within the dashboard.

Prior art indicating instruments 200, such as those shown in FIGS. 1A, 1B, 2A, and 2B, depict aftermarket tachometers with their own housings for dashboard mounting applications. Because of standard design configurations, these indicating instruments 200 are relatively deep in body thickness from the face of the instrument to the back of the housing. The thickness of these instruments 200 is dictated in large part by the size of the meter movement 210, the rear end of which is generally mounted to a printed circuit board (PCB) 230. The meter movement 210 and PCB 230 assembly is then mounted to and within the housing 240 of the indicating instrument 200, generally by mounting screws 220a and 220b, to provide a firm support for the meter movement 210, PCB 230, and related display components of the indicating instrument.

The indicating instrument of FIG. 2B is configured with dual PCBs 230 and 230', which further increases the necessary depth of the housing to enclose the additional PCB components. Generally a gap is also needed between the PCB 230' and the rear of the housing 240 in order to allow room for the circuit components mounted on and extending from the PCB 230', again deepening the housing. The design of mounting screws 220a and 220b, which extend beyond the housing in FIG. 2B, further increase the overall depth of the indicating instrument.

In aftermarket applications, such significant depth of an indicating instrument can make it difficult to fit and install on the dashboard of a vehicle, especially in the case of a narrow dashboard or a steep windshield slope. In applications where the indicating instrument is integrated into the original design of the vehicle, machine, or other system control, the prior art designs of indicating instruments require relatively deep spaces to house their functional components.

SUMMARY OF THE INVENTION

The present invention concerns the structure of and methods of constructing indicating instruments with slim profiles. What is meant by "slim profile" is that indicating instruments according to this invention are of shallow depth or are relatively thin between the face of the indicating instrument and the rear most component or the back panel of any housing enclosing the indicating instrument.

At a base level, an indicating instrument according to this invention may comprise a meter movement and a circuit board. In order to achieve the slim profile, the main body of the meter movement is situated in an aperture in the circuit board. With this placement, the front end of the body of the meter movement extends a distance in front of the circuit board and the back end of the meter movement body extends a distance behind the circuit board. Through appropriate selection and arrangement of any components on the circuit board, the circuit board can be constructed such that none of its components extend beyond the distance that the meter movement extends on either side of the circuit board. In this manner the space needed for the meter movement and the circuit board and its components collapses into the same area.

In a further embodiment, a light plate may be added to the circuit board and meter movement. The light plate may be seen as a structural framework for the indicating instrument. The light plate is a rigid, refractive material, and in one embodiment is a molded plastic plate with boss mounts and boss extensions molded as protrusions from the back side of the light plate. The circuit board is mounted to the boss mounts extending from the light plate. In this way, the boss mounts provide appropriate spacing between the light plate and the circuit board to allow room for the front end of the main body of the meter movement and any components of the circuit board to reside. The meter movement may also be mounted to the back side of the light plate to provide secure positioning of the meter movement relative to the rest of the components of the indicating instrument. In this manner, the internal components of the indicating instrument are all held together and can be calibrated and tested without the addition of any further components. This provides a benefit in that significant disassembly is avoided in the event that a functional component is bad and needs to be replaced.

In an alternative embodiment, the indicating instrument may have a second circuit board. This second circuit board may be positioned between the light plate and the first circuit board and similarly mounted to boss mounts extending from the light plate. In one embodiment, the terminals of the meter movement may be directly electrically and mechanically attached to the second circuit board.

Aside from its structural function in this invention, the purpose of the light plate is to transmit light from a light source to the face of an indicating instrument to illuminate the dial. In an embodiment of the present invention the light plate collects light from a light source, for example, a light bulb mounted on the circuit board, via a projection from the back side of the light plate that contains an aperture. The aperture is large enough to surround the light bulb projecting from the circuit board. In this manner, the light bulb need take up no more space than the gap provided between the light plate and the circuit board by the boss mounts and taken up by the meter movement and other circuit board components. The edges of the aperture in the light plate surrounding the light bulb collect the emitted light and transmit it through the light plate to its edge around the dial on the face of the indicating instrument where the light is emitted from the light plate.

The indicating instrument may further have a pointer that travels over the dial face. The pointer may be attached to a shaft extending from the meter movement through apertures in the light plate and dial face. The pointer may move in a plane above and parallel to the dial face and underneath a lens. The pointer may be halted in its travel by a pointer stop protruding from the dial face. In one embodiment, the pointer stop is a light emitting diode (LED) that further functions as an indicator of a condition of the indicating instrument. The LED is electrically and mechanically connected to the circuit board and protrudes through apertures in the light plate and dial face. The pointer stop extends above the dial face far enough to intersect the sweep of the pointer and stop the movement of the pointer.

The various components of the indicating instrument may be contained in a housing for protection or for individually mounting the indicating instrument, for example, external to an instrument panel integrated into the machinery for which the indicating instrument is providing measurements. The housing may cover the back of the indicating instrument components and be fitted with a lens through which the face of the indicating instrument may be viewed. In one embodiment, the lens is attached to the housing by a bezel surrounding circumferential edges of the lens and housing, clamping the two together. A gasket may be placed between the lens and both the housing and the edge of the light plate as a cushion and a seal. Also, in one embodiment, the housing may be formed with a circumferential ledge normal to the side wall. The boss extension of the light plate may extend beyond the edges of the circuit board to make contact with the ledge. Due to the clamping pressure of the bezel transferred through the lens and the gasket to the light plat, the light plate, supported by the boss extension, is held firmly against the housing ledge.

In another embodiment of the invention, the lens of the indicating instrument is constructed with a concentric projection around the edge of the face. This projection supports the bezel and prevents the edge of the bezel from scratching or otherwise damaging, for example, gouging or cracking, the optical surface of the lens. In yet another embodiment of the indicating instrument, the concentric projection of the lens may further be a channel bounded by two walls. Either the first wall or the second wall may provide the support to the bezel. In addition, the lens may have a concentric projection around the edge of the lens opposite the channel. With this lens construction, it is possible to place a lens on a relatively flat surface without scratching the optical surface of the lens. It is further possible to stack lenses on top of each other, for example, during shipping of lenses as individual components, with the projection of the second side fitting into the channel of the first side. In this way, the optical surfaces of the lenses are separated from each other and the lenses are unable to rub against each other, thereby preventing scratching and other damage.

An indicating instrument with a housing may be mounted on various surfaces and in various configurations through the use of a mounting strap that surrounds the housing. The mounting strap can be tightened or loosened around the housing through the use of a tightening means. The indicating instrument may be rotated within the mounting strap and secured at any position by tightening the tightening means. In one embodiment, the tightening means may be a bolt with a nut that connects two ends of the mounting strap and draws them toward each other, thereby tightening the mounting strap around the housing. Also attached to the mounting strap may be a mounting foot, which can be attached to various surfaces at various angles. In one embodiment the mounting foot can be secured into a particular position by tightening the tightening means. In the particular embodiment wherein the tightening means is a bolt, the mounting foot may similarly be held to the mounting strap by the bolt and secured when the nut is tightened.

The indicating instrument may further have an external indicator to indicate a condition of the indicating instrument. This may be the same condition or a different condition than the condition indicated by the pointer stop indicator in the embodiment previously described. The external indicator may have a mounting foot that can be held between the mounting strap and the housing of the indicating instrument, wherein the mounting foot is attached to the indicating instrument. In another embodiment, the external indicator can be mounted at a location separate from the indicating instrument, but maintain communication with the indicating instrument, for example, by wires.

BRIEF DESCRIPTION OF THE DRAWINGS

FIG. 1A is a plan view of the face of a prior art indicating instrument.

FIG. 1B is a cross-sectional view of the prior art indicating instrument of FIG. 1A from the right side.

FIG. 2A is a plan view of the face of a second prior art indicating instrument.

FIG. 2B is a cross-sectional view of the prior art indicating instrument of FIG. 2B seen from the right side showing the use of two circuit boards.

FIG. 3A is a plan view of the face of an embodiment of an indicating instrument according to the present invention.

FIG. 3B is a plan view of the right side of the indicating instrument of FIG. 3A.

FIG. 9A is a plan view of the end of a switch shaft component used with an embodiment of an indicating instrument according to the present invention.

FIG. 9B is a first plan view of a portion of the surface along the length of a switch shaft component used with an embodiment of an indicating instrument according to the present invention.

FIG. 9C is a second plan view of a portion of the surface of a switch shaft component used with an embodiment of an indicating instrument according to the present invention.

FIG. 9F is a fragmentary view, partially in cross-section, of an embodiment of an indicating instrument according the present invention detailing the placement of a switch.

FIG. 10A is a plan view of the front of a pointer used in an embodiment of an indicating instrument according to the present invention.

FIG. 10B is a partial cross-sectional view of the right side of the pointer of FIG. 10A.

FIG. 15 is a plan view of the right side of an embodiment of an indicating instrument according to the present invention, wherein the external indicator is mounted on a surface apart from the body of the indicating instrument.

FIG. 16 is a plan view of the back of an embodiment of an indicating instrument according to the present invention with an access plug removed.

FIG. 17 is a plan view of the back of the indicating instrument of FIG. 16 with the access plug in place.

FIG. 18 is a plan view of the back of an embodiment of an indicating instrument according to the present invention with an alternate wiring and access scheme.

FIG. 19 is a plan view of the right side of an embodiment of an indicating instrument according to the present invention with an alternate configuration of the external indicator and the strap pad.

FIGS. 20A and 20B are plan views of the right side of an embodiment of an indicating instrument according to the present invention in alternate upside down mounting positions with the mounting foot reversed.

FIGS. 20C and 20D are plan views of the right side of an embodiment of an indicating instrument according to the present invention in alternate upside down mounting positions with the mounting foot facing forward.

FIGS. 20E, 20F, and 20G are plan views of the right side of an embodiment of an indicating instrument according to the present invention in alternate mounting positions with the mounting foot facing forward.

FIGS. 20H and 20I are plan views of the right side of an embodiment of an indicating instrument according to the present invention in alternate mounting positions with the mounting foot reversed.

FIG. 20J is a plan view of the bottom of an embodiment of an indicating instrument according to the present invention, turned on its right side.

DETAILED DESCRIPTION OF THE INVENTION

Figure 4A:
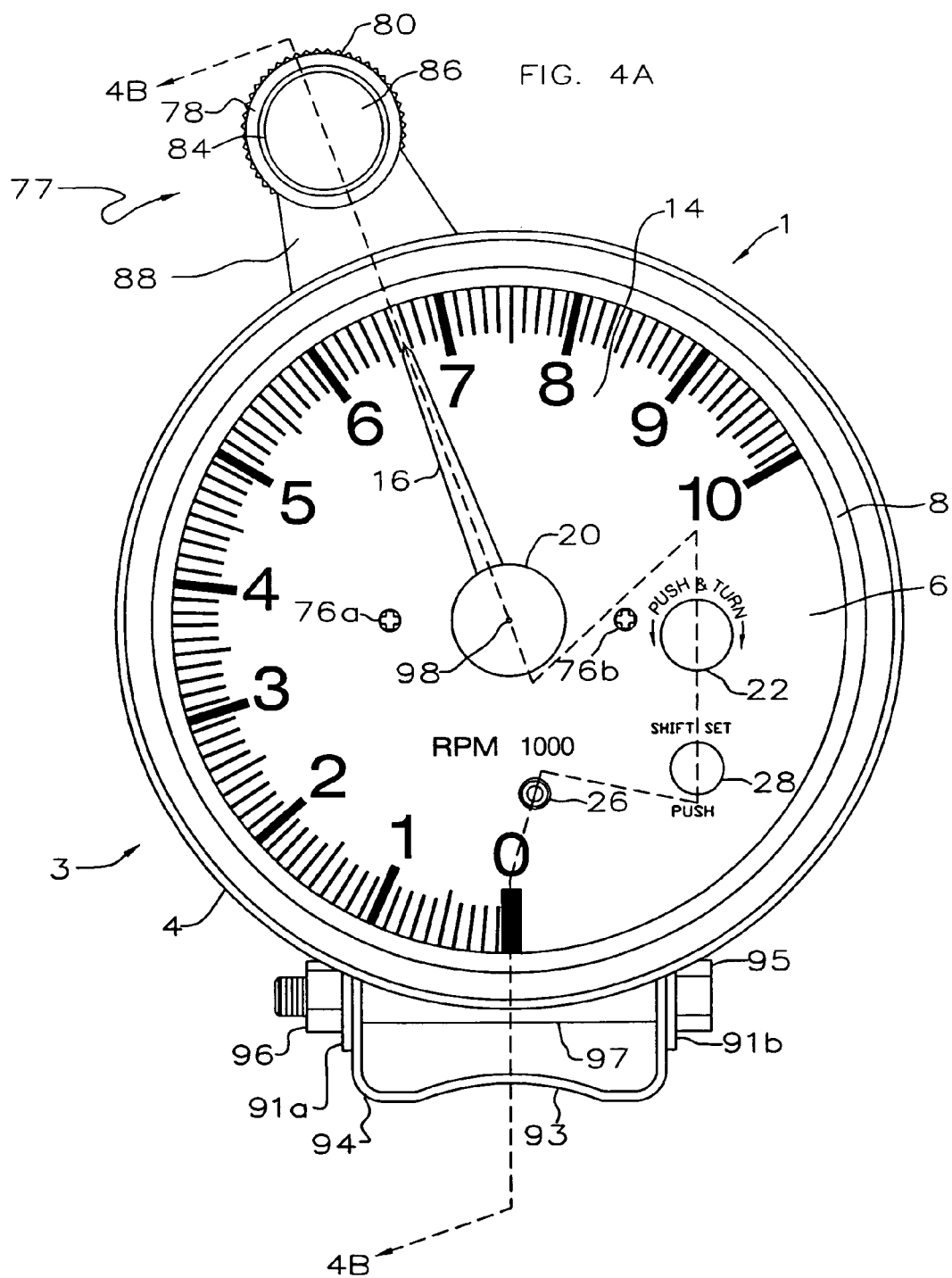
FIG. 4A is a plan view of the face of an embodiment of an indicating instrument according to the present invention.

For the purposes of providing a detailed description of an indicating instrument according to the present invention, an aftermarket automobile tachometer has been chosen as an exemplary embodiment for describing the novel features of the invention. The inventive design as translated in the tachometer is merely one representation of the application of the novel construction techniques for indicating instruments disclosed herein, which are equally applicable to indicating instruments of all types. The tachometer is chosen because of the ease of describing the novel construction techniques as applied to this particular indicating instrument. In addition, an aftermarket embodiment is chosen as a means of detailing a complete set of features (for example, an instrument including a housing), many of which would be inapplicable to an indicating instrument for an integrated application, such as if incorporated into an automobile dashboard display.

FIG. 3A shows the face 3 of an indicating instrument 1 (a tachometer) of the novel configuration disclosed herein. Primary elements of the indicating instrument seen in this view include: a housing 2 (FIG. 3B); a bezel 4 that attaches a lens 6 to the housing 2; a gasket 8 to cushion the lens 6 and separate it from a light plate 10 (FIG. 4B) and a dial face 14, which is seen through the lens 6 and is printed with the instrument markings; and a pointer 16 with a pointer cap 20, the pointer 16 indicating the instrument reading against the markings on the dial face 14. For an aftermarket automotive application, the face 3 may be of a large diameter for ease of reading by the vehicle operator. While the face 3 may be sizable, the depth of the indicating instrument 1, as viewed from the side in FIG. 3B, is substantially less than the typical prior art indicating instruments depicted in FIGS. 1B and 2B. The slim profile of the indicating instrument 1 is achieved through the novel component designs and mounting configurations of the present invention.

Figure 4B:
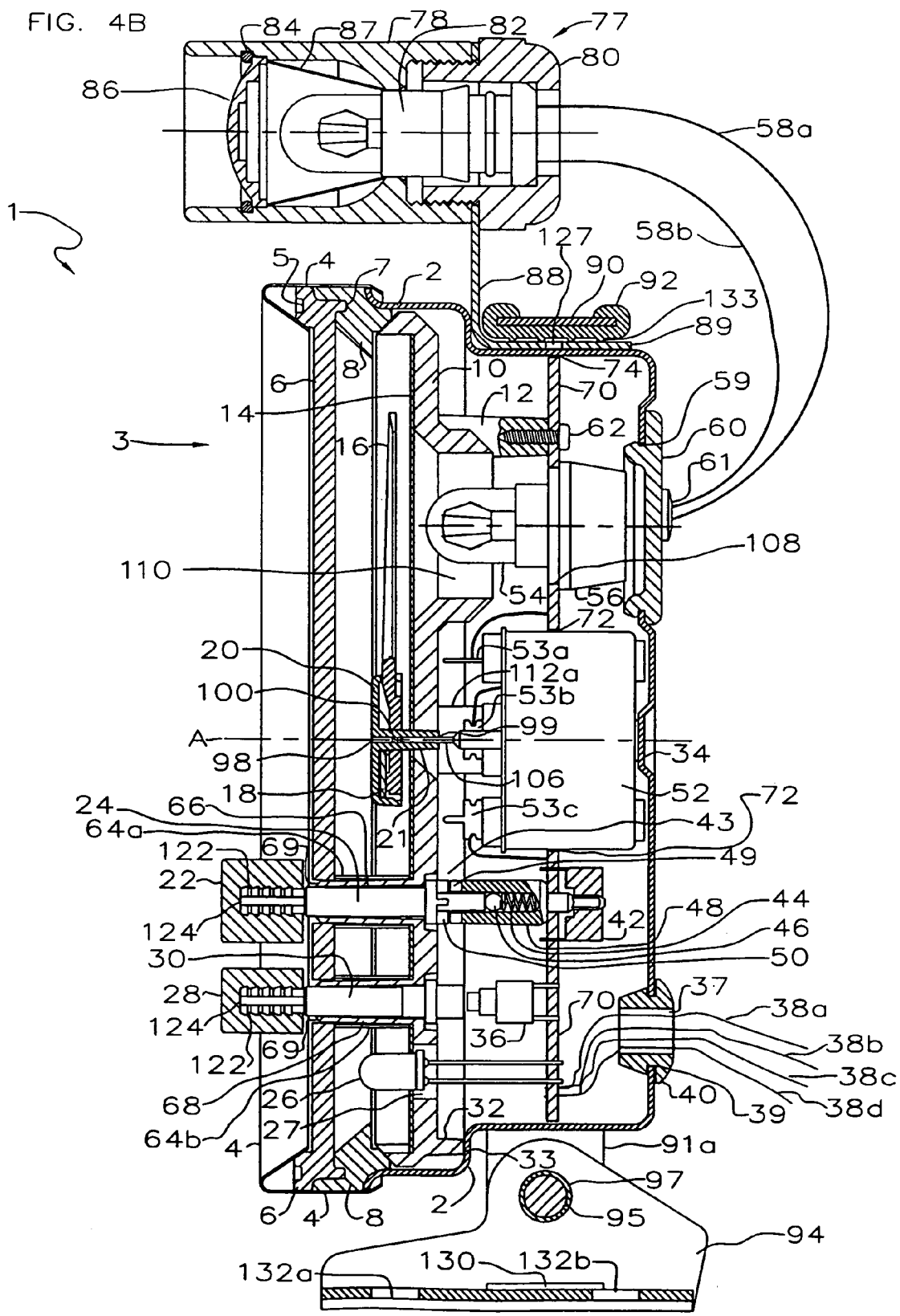
FIG. 4B is a cross-sectional view of the indicating instrument of FIG. 4A taken along line 4B—4B.

FIG. 4B depicts a cross-sectional view of the indicating instrument 1, wherein the cut-away of the section presented is indicated by the broken line 4B—4B across the face 3 of the indicating instrument 1 in FIG. 4A and the direction of the view is indicated by the arrows on the ends of line 4B—4B. Other views that may aid the reader with reference to the following discussion may be found in FIGS. 5, 6, 7A, and 7B. As is readily seen, while the face 3 of the indicating instrument 1 is quite large for ease of viewing, the housing 2 containing the components of the indicating instrument 1, in contrast, defines a very slim profile. A significant space savings is achieved through novel designs and arrangements of the components within the housing of the indicating instrument 1.

The most significant space saving design feature is an aperture created in the printed circuit board (PCB) 70, the PCB hole 72, through which the meter movement 52 is placed, rather than mounting the meter movement 52 behind the surface of the PCB 70 as in prior art designs. The meter movement 52 translates electrical impulses into rotational movement to move the pointer 16 around the dial face 14. By placing the meter movement 52 so that it extends through the plane of the PCB 70, a slimmer profile housing 2 can be used. The circuit components 134 (FIGS. 7A and 7B) on each side of the PCB 70 may be chosen to extend no more than the thickness of the meter movement 52 protruding from either side of the PCB 70, thereby combining two depth intensive components in the same space.

Figure 8:
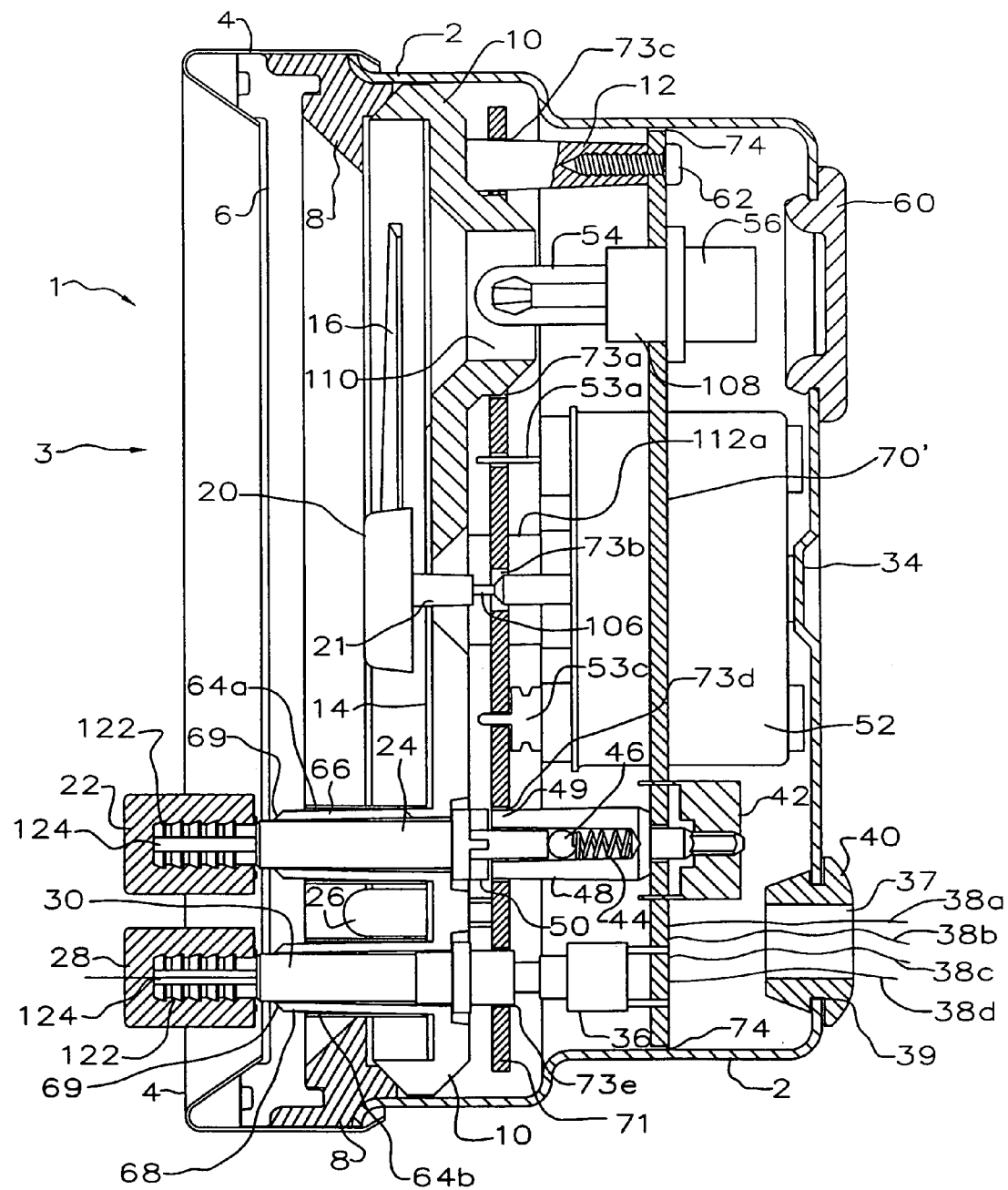
FIG. 8 is a cross-sectional view of an embodiment of an indicating instrument utilizing two circuit boards according to the present invention.

A second embodiment of an indicating instrument 1 according to the present invention is shown in FIG. 8. In this instance, the diameter of the indicating instrument 1 is required to be smaller, for example because of space constraints on the area allotted to the size of the face 3 in an instrument collection. It is often the case that a second PCB 71 is then needed to accommodate all the circuit components that can no longer fit on a single, smaller-diameter PCB 70'. The concept of providing a hole in the PCB 70' to encompass a component (e.g. the meter movement 52) can be expanded to the second PCB 71 to achieve a slim profile indicating instrument 1, even with a decreased diameter. The meter movement 52 may be mounted so that it extends through a hole in the plane of the first PCB 70' and the second PCB 71 may be mounted in front of meter movement 52, between the meter movement 52 and the light plate 10.

The second PCB 71 may have multiple apertures for accommodating various components in the indicating instrument 1. For example, in the second embodiment depicted in FIG. 8, the second PCB 71 has a light plate hole 73a for accepting the extension of the light plate 10 that encircles the lamp 54 to collect the emitted light; a shaft hole 73b through which the shaft 106 extending from the meter movement 52 extends to connect with the pointer 16; one or more boss mount holes 73c allowing the boss mounts 12 to attach to the first PCB 70, and a pot extension hold 73d and a switch extension hole 73e through which the pot shaft extension 24 and switch shaft extension 30, respectively, may extend to protrude above the face 3 of the indicating instrument 1. The second PCB 71 is held in radial alignment by the protrusion of these various components through these various holes. The second PCB 71 is held in axial alignment by the direct connection of the terminals 53a, 53b (not shown in FIG. 8), and 53c of the meter movement 52 to the PCB 71. (In the embodiment of FIG. 7A, the terminals 53a–c of the meter movement 52 are connected to the PCB 70 by meter movement leads 114a–c.) Through this novel configuration of the PCBs 70', 71, the axial length needed for the housing 2 covering the components of the indicating instrument 1 is minimized. In fact, the additional axial length needed may be as little as the thickness of the second PCB 71.

As seen in prior art FIGS. 1B and 2B, the common internal mounting structure in the prior art indicating instruments 200 is through the use of long bolts 220a–b and spacers 225a–b that thread through the PCB 230 and the housing 240, thereby attaching the components to the housing 240. The use of these bolts 220a–b additionally increases the thickness of the prior art indicating instruments 200 because of the bolt heads and nuts needed to fasten the bolts 220a–b in place.

A second, novel, space-saving technique of the present invention is the use of a light plate 10 as the principle mounting structure in the indicating instrument 1, as seen in FIG. 4B. Light transmission based on light pipe technology (the use of internally refractive composite materials that can reflect light to travel throughout the materials' structure) is commonly used in indicating instrument construction. Light pipes of various configurations are used in the prior art to transmit light from a light source to illuminate the face of an indicating instrument. In an embodiment of the present invention, light pipe material is fabricated into a generally disk-shaped light plate 10. The circumferential edges of the light plate 10 are beveled to reflect light, originating from behind the dial face 14, across the face 3 of the indicating instrument 1. Lamp 54 interfaces with lamp socket 56, which is mechanically and electrically connected with PCB 70 through socket aperture 108, thereby holding the lamp 54 in proper position and providing electrical power to illuminate the lamp 54. The lamp 54 is positioned within a aperture 110 protruding from the rear of the light plate 10, whereby the edges of the light plate 10 surrounding the protruding aperture 110 collect the emitted light from lamp 54 and direct it to the face 3 of the indicating instrument 1.

Figure 6:
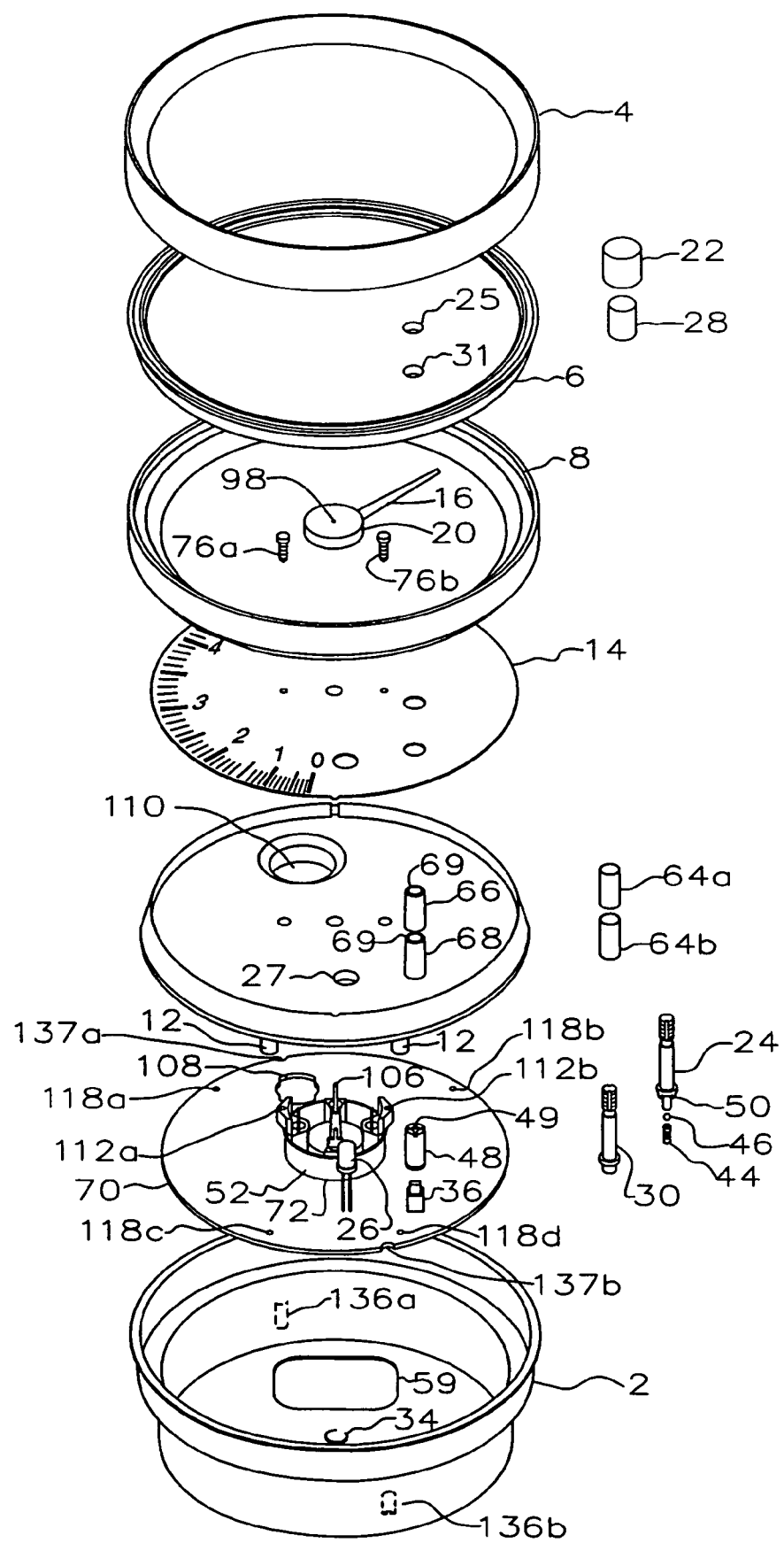
FIG. 6 is an exploded isometric view of the components of an embodiment of an indicating instrument according to the present invention.
Figure 7A:
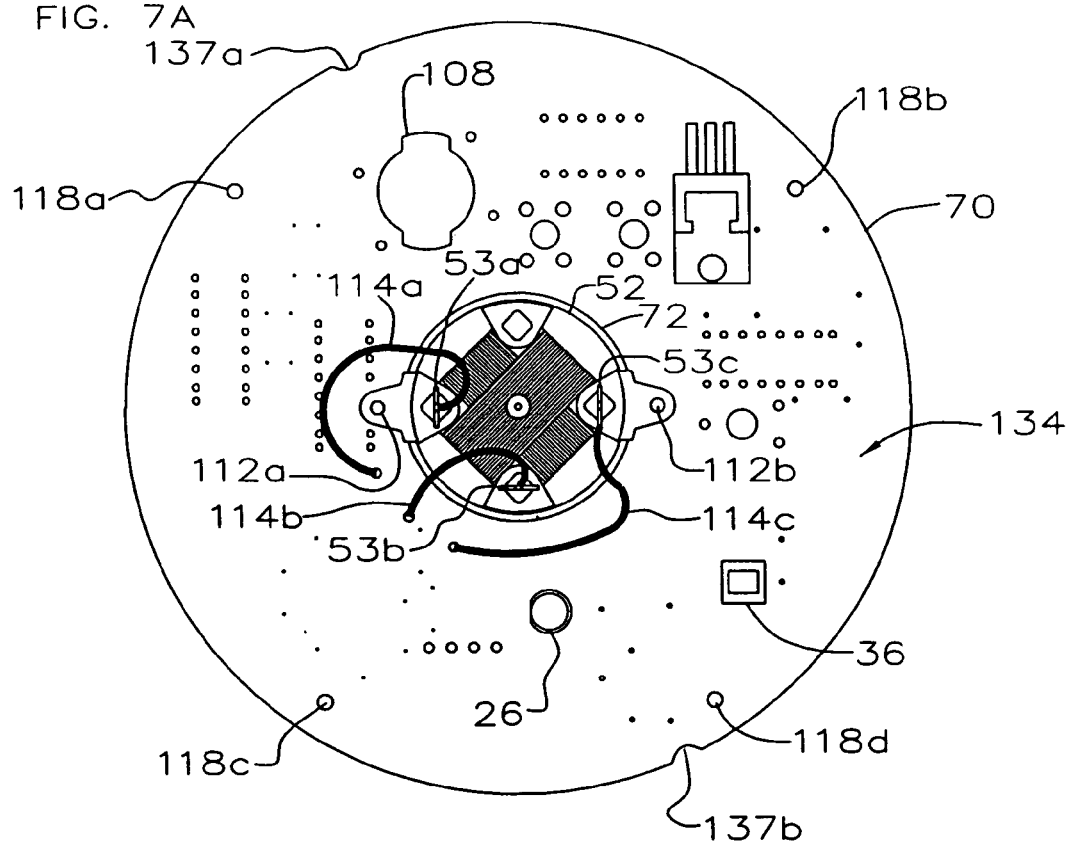
FIG. 7A is a plan view of the front side of a circuit board of an embodiment of an indicating instrument according to the present invention.
Figure 7B:
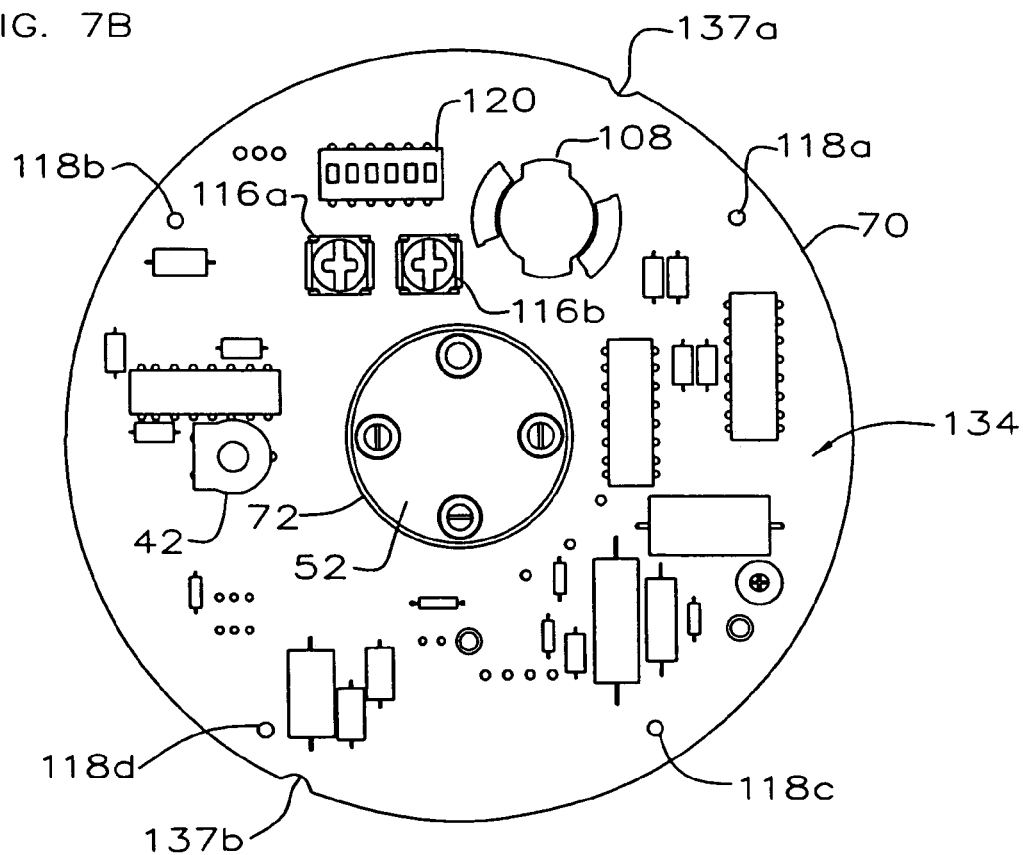
FIG. 7B is a plan view of the back side of the circuit board of FIG. 7A.

In addition to transmitting light to the dial 14, this invention further utilizes the light plate 10 as a mechanical framework to mount components, align parts, and facilitate the manufacture and functioning of the indicating instrument 1. To achieve the benefits of a slim profile for the indicating instrument 1, the light plate 10 may be fabricated to include additional structures such as boss mounts 12 and boss extensions 32. The boss mounts 12 may be generally cylindrical appendages with either threaded molded holes or self tapping apertures for receiving mounting screws. The boss mounts 12 extend from the rear of the light plate 10 to create a gap between the light plate and PCB 70. The PCB 70 is attached to the boss mounts 12 with mounting screws 62 through mounting screw apertures 118a–d (FIG. 6). The gap between the light plate 10 and PCB 70 is sized to allow sufficient room for circuit components 134 (FIGS. 7A and 7B) on the PCB 70, the extension of the meter movement 52 through the PCB 70, and other features to be described herein.

The boss extensions 32 in the described embodiment may be smaller, shorter extensions from the light plate 10 that are sized to space the light plate 10 away from a ledge 33 in the wall of the housing 2. The boss extensions 32 provide firm axial alignment of the light plate 10 against the housing 2 and thereby prevent axial movement of the PCB 70, of the meter movement 52, and of other components affixed to the light plate 10 within the housing 2. The measurements of the boss mounts 12, boss extensions 32, and housing ledge 33 are all chosen in relation to each other to provide appropriate spacing between components, while still achieving a slim profile for the indicating instrument 1.

The light plate 10 further supports and provides a mounting surface for the dial face 14 and the meter movement 52. The dial face 14 is situated directly upon a flat surface of the light plate 10. Meter movement mounts 112a–b (FIG. 6) extend from the meter movement 52 and are attached to the light plate 10 with dial face screws 76a–b. The dial face screws 76a–b also secure the dial face 14 to the light plate 10 and further act to align the dial face with reference to the other functional and display components on the face 3 of the indicating instrument 1. In this way, the light plate 10 acts as a framework to hold all functional parts as one assembly. This allows complete calibration and testing of the functional components of an indicating instrument 1 before installing the functional components in the housing 2 or other environment and attaching any associated peripheral parts. The ability to test the functionality of an indicating instrument 1 before it is encompassed in a housing 2 is a great benefit to manufacturing economy, as malfunctioning components can easily be replaced without having to take apart the entire indicating instrument 1.

Another function of the light plate 10 is to provide radial and axial alignment of the components with respect to the housing 2. Radial alignment is provided by the abutment of the exterior circumference of the light plate 10 with the internal wall 74 of the housing 2. In this exemplary embodiment, PCB 70 also has alignment notches 137a–b (FIG. 5) that mate with housing indentions 136a–b (FIG. 6) in housing 2 providing additional radial alignment and preventing rotational movement around a center axis A. Since the PCB 70 is attached to the light plate 10, the conjunction of the alignment notches 137a–b and the housing indentions 136a–b provide radial stability to all the components of the indicating instrument 1. Other means of radial alignment of components through an interface with the housing 2 are well known in the art. Axial alignment is provided by the contact between the boss extensions 32 and the housing ledge 33 as described above. Axial alignment may also be augmented by dimple 34 in the rear of the housing 2, which limits any movement of the meter movement 52 in the housing 2.

The light plate 10 also receives holding pressure from the face 3 of the indicating instrument 1, thereby further preventing axial rotation, by the combination of the lens 6 and a gasket 8. The gasket 8 may be rubber, or other similar elastic but minimally compressive material, that provides spacing between the dial face 14 on the light plate 10 and the lens 6 to allow room for the pointer 16 to sweep the dial face 14. The lens 6 is placed opposite the light plate 10, sandwiching the gasket 8 in between. The lens 6 is held against the gasket 8 by a bezel 4, which clamps around the circumference of the face 3 of the indicating instrument 1, clasping the lens 6 along one edge of the bezel 4 and the housing 2 along a second edge of the bezel 4. The combination of the lens 6, gasket 8, light plate 10, bezel 4, and housing 2 fixes the entire internal assembly of the indicating instrument 1 in place.

Additional projections from the light plate 10, extending in the direction of the face 3 and identified as pot tube 66 and switch tube 68, also prevent rotation of the various components relative to each other. Pot tube 66 and switch tube 68 may be of unitary construction with the light plate 10 and extend though apertures in the dial face 14 and lens 6, positively aligning the dial face 14 and the lens 6. The pot tube 66 and switch tube 68 also provide good bearing surfaces for pot shaft extension 24 and switch extension 30, which are further described later herein.

Figure 9D:
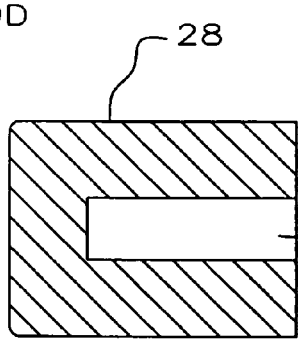
FIG. 9D is a cross-sectional view of a knob for a switch shaft component used with an embodiment of an indicating instrument according to the present invention.
Figure 9E:
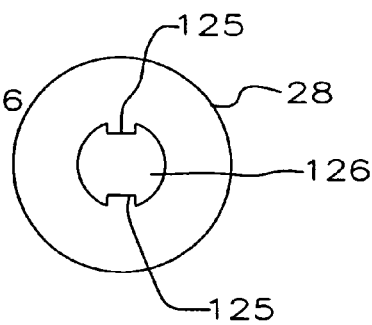
FIG. 9E is a plan view of the bottom of the knob of FIG. 9D.

A design feature may be added to the pot tube 66 and switch tube 68 to control unwanted light transmitted through the pot tube 66 and switch tube 68 as they are integral to the light plate 10. This escaping light is prevented by forming the ends of the pot tube 66 and switch tube 68 projections as conical surfaces 69 (of approximately 45° angles). See FIG. 9F. The conical surfaces refract the light harmlessly inward toward the pot shaft extension 24 and the switch shaft extension 30. Also, opaque tubing 64a–b may be placed over the pot tube 66 and switch tube 68 projections between the dial face 14 and the lens 6 to contain unwanted light.

Figure 11:
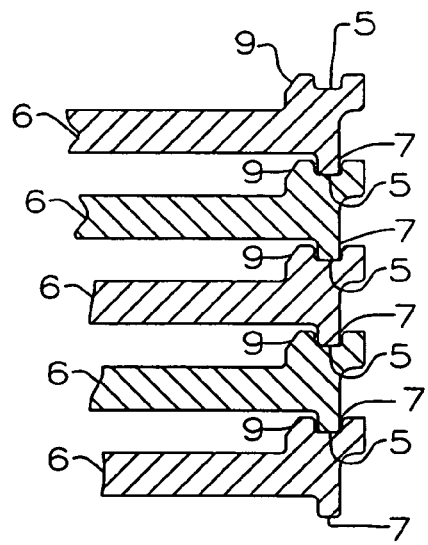
FIG. 11 is a partial view in cross-section of stacked lenses used in an embodiment of an indicating instrument according to the present invention.

It is preferred that lens 6 have smooth polished surfaces with optical clarity. However, this is not a requirement for the functionality of the invention. Prior art indicating instrument 200 lenses 250, seen in FIGS. 1B and 2B are typically made as flat disks. The lens surfaces are very sensitive to scratching that can result if lenses are allowed to move and touch each other, which is usually the case as prior art lenses are stacked for shipping or for availability during the assembly of the indicating instruments 200. This can be a very serious problem, which often demands careful individual wrapping of individual lenses for storage and handling before assembly into the indicating instruments 200. The present invention solves the problem of scratched lenses 6 by forming a concentric channel 5 and a concentric projection 7 around the circumference of each lens 6, as shown to best advantage in FIG. 11. The concentric projection 7 of a first lens 6 can rest in the concentric channel 5 of a second lens 6, thereby interlocking in such a way as to provide good separation and to prevent radial movement between each lens 6 when stacked for shipping or use in assembly of indicating instruments 1. Thus the surfaces of lenses 6 are well protected for bulk handling.

Figure 12:
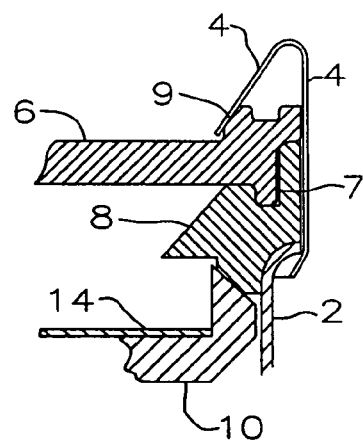
FIG. 12 is a partial view in cross-section of the assembly of the face of an embodiment of an indicating instrument according to the present invention.

The lens 6 may also be protected from the sharp edge of the bezel 4 upon assembly to prevent damage to the lens 6. Prior art indicating instruments 200, as seen in FIGS. 1B and 2B, typically add a spacer 260 between the bezel 270 and lens 250. The present invention provides for a proper spacing between the sharp edge of the bezel 4 and the optical surface of the lens 6 as shown in FIG. 12. By spacing the walls forming the concentric channel 5 to support the bezel 4 and designing the interior wall forming the concentric channel 5 with a conical surface 9 to mate with the angle of the bezel 4, the edge of the bezel 4 may be spaced apart from the surface of the lens 6. Designing the concentric channel 5 to support the bezel 4 fulfills the need of protecting the optics of the lens 6 without the cost of an extra part (i.e., a spacer) and its handling in production.

As shown, for example in FIGS. 4A and 4B, wherein the indicating instrument 1 is a tachometer, the lens 6 is constructed with two apertures, a pot shaft aperture 25 and a switch shaft aperture 31, through which the pot tube 66 and switch tube 68 extending from the light plate 10 pass, respectively. In the embodiment depicted, pot tube 66 and switch tube 68 extend no further than the exterior surface of the lens 6. A pot shaft extension 24 and a switch shaft extension 30 extend from a pot 42 and a switch 36, respectively, mounted on the PCB 70, through the pot tube 66 and switch tube 68, respectively, and extend above the exterior surface of the lens 6 for actuation by a user. This design eliminates the need for additional, bulky interface structures 275 externally attached to the indicating instrument 200 for user control, as seen in prior art FIGS. 1A and 2A. It may be desirable to provide user accessible controls on the face 3 of other types of indicating instruments 1, and the techniques and configurations described herein with reference to the example tachometer are not meant to be limited to only that embodiment, but may be used to provide other types of control mechanisms to various embodiments of indicating instruments 1.

Figure 5:
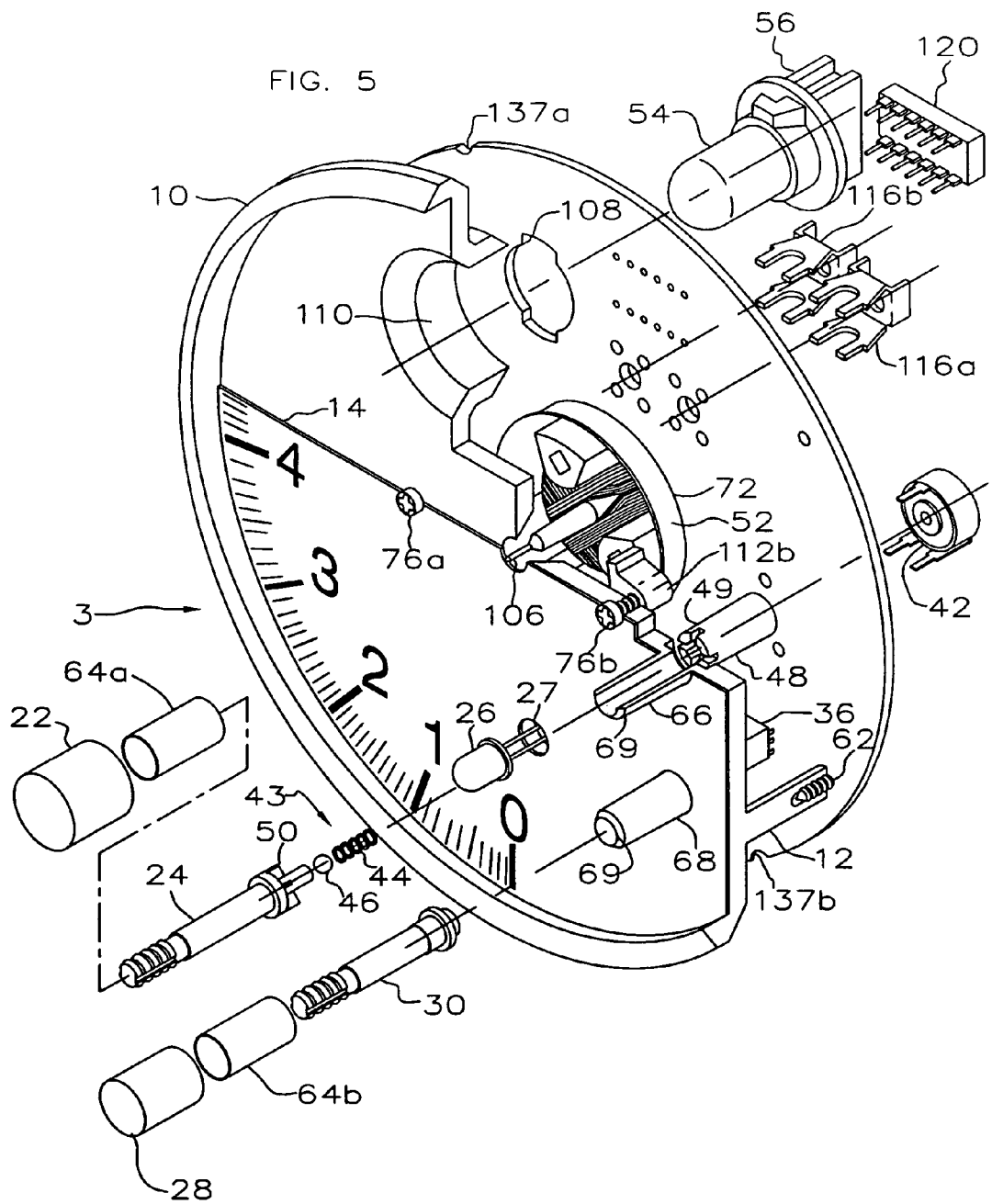
FIG. 5 is an exploded isometric view of the construction of the face and circuit board assembly of an embodiment of an indicating instrument according to the present invention.

In the case of an indicating instrument 1 that is a tachometer, as in this example embodiment, the pot 42 and switch 36 enable a user to set an RPM limit, at which point a shift indicator 26 is activated to signal to a driver that the chosen RPM has been reached. When the switch 36 is depressed, current from the pot 42 (e.g., a potentiometer) is allowed to pass to the meter movement 52 and sweep the pointer 16 to a desired RPM limit. By varying the pot, and the current through it, a desired RPM limit can be set. A clutch engagement 43, as seen in FIGS. 4B and 5, is used between the pot shaft extension 24 and the pot 42 to prevent accidental re-setting of an indicator trigger point. This invention incorporates a hard, smooth clutch ball 46 between a clutch spring 44 and a clutch base 48, all of which are contained in a cavity in the pot 42. The clutch base 48 interfaces with the pot shaft extension 24, but the clutch ball 46 and clutch spring 44 eliminate possible torque transmittal to the pot 42 without depression of the pot shaft extension 24, and thereby accidental resetting of the indicator 26 limit, at very low cost. When the pot shaft extension 24 is depressed and rotated, the clutch base 48 pushes against the clutch ball 46 and depresses the clutch spring 44, whereby a dog 50 on the pot shaft extension 24 engages a second dog 49 on the clutch base 48, thereby transmitting rotation from the pot shaft extension 24 to the pot 42 for setting the RPM limit.

Attached to the external ends of the pot shaft extension 24 and the switch shaft extension 30 are a pot knob 22 and a switch knob 28, respectively, for ease of grasp by a user, allowing a user to manipulate and control the pot 42 and switch 36 functions. Prior art typically uses setscrews or holding clips for knob to shaft attachment. The present invention uses a novel knob to shaft attachment system that is shown in detail in FIGS. 9A–F in exemplary fashion with respect to the switch knob 28 and switch shaft extension 30, but equally applicable to the pot knob 22 and pot shaft extension 24, or any other knob to shaft attachments in any application.

The switch knob 28, which may be made of rubber or other minimally compressive elastic material, has axial keys 125 molded integrally within a cavity 126 within the shift knob 28. The switch shaft extension 30 has mating axial keyways 124 molded in place. The switch shaft extension 30 also has a series of concentric barbs 122 that allow easy installation of the switch knob 28 on the switch shaft extension 30. While the installation of the shift knob 28 on the switch shaft extension 30 is easy, the interference between the walls of the shift knob cavity 126 and the concentric barbs 122 on the switch shaft extension 30 prevent the easy removal of the shift knob 28. This knob to shaft system results in secure fixing of knobs on shafts at a low manufacturing cost.

Most indicating instruments with a sweeping pointer require a pointer stop. Prior art pointer stops 280, as seen in prior art FIG. 2A, typically employ a small metal post riveted to the dial in the vicinity of the zero mark to ensure that pointer 285 is at the zero position when there is no power or no signal condition. An embodiment of the present invention, as shown, for example, in FIGS. 3A, 4A, and 4B, utilizes a shift indicator 26, which may be a light emitting diode, and which connects to the PCB 70, extending through an aperture 27 in the light plate 10, and protruding through the dial face 14. The shift indicator 26 may be placed in an appropriate location near the zero mark on the dial face 14 to act as a stop for the pointer 16. This eliminates the cost of a metal post and its assembly to the dial face 14, while providing a valuable signaling feature to the user.

In the depicted embodiments, the pointer 16 may be constructed of molded plastic. The pointer 16 is covered by a pointer cap 20, also of molded plastic, which has a shaft 21 (FIG. 4B) that extends through the pointer 16, the dial face 14, and the light plate 10 to engage the shaft 106 extending from the meter movement 52. A detail of the pointer assembly is shown in FIGS. 10A and 10B. The pointer cap 20 also conceals the pointer counterweight 18, which balances the pointer 16 as it moves through its sweep. A small hole 98 may be molded into the front of the pointer cap 20 and extend as a cavity through a length of the pointer shaft 21. A rear cavity 99 in the opposite end of the pointer shaft 21 also extends through a second length of the pointer shaft 21. In a departure from the prior art, seen in FIG. 1A, in which the pointer 285 is generally metallic with a through-hole for mounting the pointer 285 on a shaft, the hole 98 in the pointer cap 20 and the rear cavity 99 opposite it in the pointer shaft 21 are both blind holes in the present invention, but they come very close to meeting each other. A very thin membrane 100 separates the pointer cap hole 98 from the rear cavity 99 in the pointer shaft 21. As is known in the injection molding art, molding two blind holes is easier and less expensive than molding one through-hole.

Aside from being a subtle styling feature, the pointer cap hole 98 has several useful purposes. First, the pointer cap hole 98 can be used with a special "pointer puller," similar to a gear-puller, to remove the pointer 16 assembly from shaft 106 extending from the meter movement 52 during production if removal and replacement of pointer 16 is needed. Use of a pointer-puller eliminates the possibility of excessive force being placed on the thrust bearing of the meter movement 52 during removal of the pointer 16 from the shaft 106. From an injection molding standpoint, the pointer cap hole 98 in the center of the pointer cap 20 reduces unsightly sink marks on the flat pointer cap 20 surface that can result from the injection molding process.

In addition to the shift indicator 26 protruding from the face 3 of the indicating instrument 1, it may be desirable to provide a user with an external indicator to provide a greater degree of notification of the conditions measured by the indicating instrument 1. In the example embodiment of the tachometer described herein, an external indicator 77, shown for example in FIGS. 4A and 4B, is provided as a more visible indicator of when the RPM threshold is reached. The external indicator 77 may comprise a cylindrical housing 78, which screws into a threaded rear cap 80. The rear cap 80 may hold a lamp and socket assembly 82, which illuminates the external indicator 77, thereby providing the notification to the user. A lens 86 may be held in the indicator housing 78 by a retention ring 84, for example, a readily available rubber O-ring. Such a retention ring 84 is easy to install, inexpensive, and the elasticity of the rubber compensates for tolerance variations and provides rattle free operation.

Figure 13A:
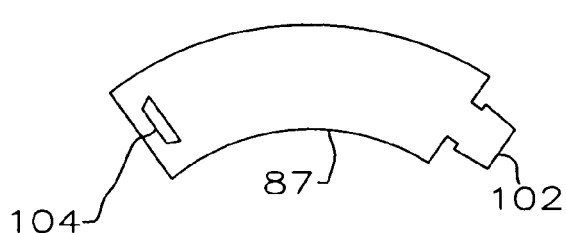
FIG. 13A is a plan view of a reflector, prior to assembly, for use in an external indicator of an embodiment of an indicating instrument of the present invention.
Figure 13B:
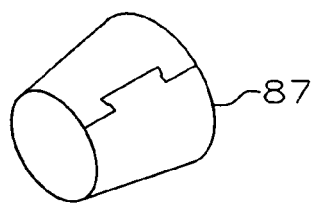
FIG. 13B is an isometric view of the reflector of FIG. 13A assembled.

A thin sheet of reflective material may be used for a reflector 87 to improve the light output of external indicator 77. In one embodiment, a die-cut piece of white or reflective material is rolled into a conical shape and placed in the housing. See FIGS. 13A and 13B. The depicted embodiment includes special die cut ends for the reflector 87, wherein the tabbed end 102 slips into the slotted end 104. The die-cut tabbed and slotted ends provide for easier handling of the reflector 87 during production and allow the reflector 87 to more easily stay in position. Once assembled, the conical form of the reflector 87 is securely held together for easy installation.

As shown in FIGS. 4A, 4B, 15, and 19, the external indicator 77 may be alternately mounted to the housing 2 or positioned apart from the rest of the indicating instrument 1. In the depicted embodiments, the external indicator 77 is attached to a mounting bracket 88. In the embodiment shown in FIGS. 4, 4A and 4B, the mounting bracket 88 is secured between the rear cap 80 and the external indicator housing 78. The mounting bracket 88 is further secured to the housing 2 of the indicating instrument 1 by mounting strap 90. The bracket foot 89 of the mounting bracket 88 is restrained under mounting strap 90 that is secured around the circumference of the housing 2. The bracket foot 89 may be arced to fit against the curvature of the housing 2. FIG. 19 depicts an embodiment wherein the bracket foot 89 is reversed in its attachment to both the external indicator and the housing 2. In this embodiment, the external indicator 77 is seated further back with respect to the indicating instrument 1, which could be useful depending upon the space configurations of the environment in which the indicating instrument 1 is to be mounted.

The embodiment of FIG. 15 shows the mounting bracket 88 mounted at a location remote from the indicating instrument 1. This embodiment allows the user to locate the external indicator 77 at a more optimal location for conspicuous notice by a user. The bracket foot 89 can likewise be reversed with respect to the external indicator 77 in this embodiment. The bracket foot 89 of the mounting bracket 88 may have one or more apertures 127 (FIG. 4B) to allow for a simple attachment of the external indicator 77 to a surface, such as by one or more screws 128 (FIG. 15) placed through the apertures 127 and secured into the surface.

A means of communication is needed in order to mount the external indicator 77 remotely from the indicating instrument 1. In the embodiment depicted in FIG. 15, this communication is accomplished by lead wires 58*a*–*b* connected to lead connectors 116*a*–*b* (FIGS. 7B and 16) on the PCB 70 at a first end and connected to the external indicator 77 at a second end. The lead wires 58*a*–*b* exit the rear of the housing 2 via an aperture 59, as shown in FIGS. 16 and 17. The aperture 59 is depicted in FIG. 17 with a plug 60 that itself has an aperture 61 allowing the lead wires 58*a*–*b* to pass through the plug 60 and connect to the external indicator 77. The plug may be rubber or similar minimally compressive, elastic material. The plug 60 protects the lead wires 58*a*–*b* from potential damage by the potentially sharp edges of the housing 2 forming the aperture 59, and also provides a removable seal to access components inside the housing 2.

The aperture 59 in the depicted embodiment is a large opening allowing the user to access several functional components of the indicating instrument 1. As discussed, the aperture 59 provides access for attachment of the lead wires 58*a*–*b* to the lead connectors 116*a*–*b* on the PCB 70. Aperture 59 further allows access to the lamp socket 56 for removal and replacement of the lamp 54, for instance if the lamp 54 burns out. Aperture 59 may also provide user access to controls for specific configurations of the indicating instrument 1. In the example embodiment of the tachometer, the aperture 59 provides access to a dip switch 120 for selection of the number of cylinders of the vehicle to provide appropriate timing information to the tachometer so that it can accurately measure the rotations of the engine.

In the embodiment depicted in FIGS. 16 and 17, the indicating instrument 1 further has a second aperture 39 in the rear wall of the housing 2. This aperture 39 provides a passage for signal wires 38*a*–*d* from their connection points on the PCB 70 to connection points in the environment from which they measure data. Signal wires 38*a*–*d* may also be power transmission wires for providing power to the indicating instrument if needed. In the case of the tachometer example, two of the signal wires, for example 38*a*–*b*, are used to supply power to the tachometer. A third signal wire, for example 38*c*, is used to measure spark firings through which the RPMs are measured. A fourth wire, for example 38*d*, is connected to the automobile's dash board illumination switch and supplies power for illumination of the indicating instrument. The aperture 39 is lined with a grommet 40 that itself has an aperture 37 through which the signal wires 38*a*–*d* pass. Similar to the plug 60, the grommet 40 protects the signal wires 38*a*–*d* from the potentially sharp edges of the housing 2 around the aperture 39. A conical surface as depicted (FIG. 4B) on the insertion edge of the depicted grommet 40 enables easy installation of the grommet 40 within the aperture 39 by axial pressure.

In another embodiment of an indicating instrument 1, as shown in FIG. 18, connections for lead wires 58*a*–*b* and user setting interfaces may be accessible at the surface of the housing 2 itself, without providing access to the PCB 70. The indicating instrument 1 of FIG. 18 is an embodiment wherein a selection switch 121 accessible through an aperture in the housing 2 allows the user to make a cylinder number selection for the vehicle. Similarly, a protruding clip connector 117 provides an easily accessible attachment means for the lead wires 58*a*–*b*. Access to other user options and functionality connections for an indicating instrument 1 may similarly be provided.

Figure 14A:
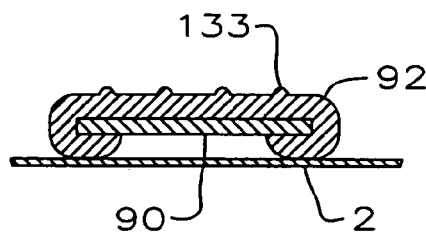
FIG. 14A is a cross-sectional view of a first configuration of a strap, strap pad, and housing in an embodiment of an indicating instrument according to the present invention.
Figure 14B:
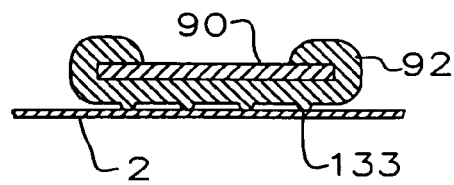
FIG. 14B is a cross-sectional view of a second configuration of a strap, strap pad, and housing in an embodiment of an indicating instrument according to the present invention.

The mounting strap 90 described previously and shown in FIGS. 4B, 14A, 14B, 15, 18, and 19 may be a metal band formed to fit around the circumference of the housing 2. The mounting strap 90 may have outturned ends 91*a*–*b* that are held together around the housing 2 by a mounting bolt 95 and nut 96. A constant distance may be maintained between outturned ends 91*a*–*b* by a bolt sleeve 97 placed around the shaft of the mounting bolt 95 between the outturned ends 91*a*–*b*. Any other conventional means for tightening or clamping the mounting strap 90 around the housing 2, for example, a clamp, a buckle, and a compressive spring force inherent in the mounting strap 90, are contemplated within the scope of the invention. A strap pad 92, for example of rubber or similar minimally compressive, elastic material, designed to wrap around metal strap 90 may additionally be placed on the mounting strap 90. The wrap-around design of the strap pad 92 covers the potentially sharp edges of the mounting strap 90 providing better safety and appearance. Small ribs 133 may be formed on the bottom side of the strap pad 92, as shown in FIGS. 4B and 14B, to provide, for example, extra flexibility for good conformance of the mounting strap 90 to irregularities in the housing 2 surface, a high friction interface between the housing 2 and mounting strap 90 preventing movement therebetween, and accommodation for the extra thickness of the bracket foot 89 of the external indicator 77 mounting bracket 88. The strap pad 92 may be optionally mounted on mounting strap 90 with the ribs 133 facing radially outwards as shown in, for example, FIGS. 14A and 19 for a different aesthetic appearance.

Once assembled, the mounting strap 90, strap pad 92, and mounting bolt 95 assembly holds itself together around the housing 2. The assembly also allows for easy adjustment of radial position of the indicating instrument 1 within the mounting strap 90 by simply loosening the mounting bolt 95 and rotating the indicating instrument 1. The design allows the indicating instrument 1 to be rotated 360° in relation to mounting strap 90 and mounting foot 94. This provides maximum flexibility and adaptability for installation of indicating instrument 1.

The mounting foot 94 may be similarly attached to the mounting strap 90 by the mounting bolt 95, and thereby pivot around the axis of the mounting bolt 90. The design of the mounting foot 94 offers great flexibility of positioning and use of the indicating instrument 1 as shown in FIGS. 20A–J. The mounting foot 94 may be attached to point forward, as in FIGS. 20C–G and 20J, or to the rear, as in FIGS. 20A–B and 20H–I, allowing the indicating instrument 1 varying degrees of tilt in the mounted placement. Any particular angular position of the indicating instrument 1 with respect to the mounting foot 94 may be held by simply tightening the mounting bolt 95 and nut 96. The mounting foot may similarly be rotated 360° with respect to the indicating instrument housing 2 by rotating the mounting strap 90 around the housing 2. Such versatility in the mounting foot 94 allows the indicating instrument 1 to be mounted in diverse positions and locations and be placed into many different environments. For example, with a tachometer embodiment, by rotating the mounting foot 94 around the mounting bolt 95 and rotating the mounting foot 94 around the housing 2, the tachometer could variously be mounted in an automobile, for example, to the dashboard, the underside of the roof, a window column, a reinforcement post, or a roll bar.

Attachment of the mounting foot 94 to various surfaces may be achieved in a number of ways. The mounting foot may be provided with apertures 132a–b in its base for the reception of in attachment means, for example screws. Mounting foot 94 may further be configured with an arch 93 in its base so that the mounting foot 94 may better conform to a curved surface such as a window column, reinforcement post, or roll bar. The mounting foot 94 may further be provided slots 130 for the acceptance of a band for retaining the indicating instrument 1 against a surface. The band may be for example, a fabric or plastic strap, or even an hose clamp, that may slip thorough the slots 130 and around a mounting surface such as a reinforcement post or roll bar. The mounting foot 94 may further be attached to a surface with an adhesive placed between the mounting foot 94 and the surface.

Although various embodiments of this invention have been described above with a certain degree of particularity, or with reference to one or more individual embodiments, those skilled in the art could make numerous alterations to the disclosed embodiments without departing from the spirit or scope of this invention. It is intended that all matter contained in the above description and shown in the accompanying drawings shall be interpreted as illustrative only of particular embodiments and not limiting. Changes in detail or structure may be made without departing from the basic elements of the invention as defined in the following claims.

What is claimed is:

1. A lens comprising
a first face;
   the first face comprising a channel around a peripheral edge of the lens; and
a second face;
   the second face comprising a projection around the peripheral edge of the lens;
wherein when at least two lenses are stacked upon each other, the projection of the second face of a first lens engages the channel of the first face of a second lens, preventing relative movement between the first lens and the second lens and maintaining a gap between the second face of the first lens and the first face of the second lens.

2. The lens as described in claim 1, wherein
at least a portion of the first face comprises an optical surface; and
the channel further comprises:
   a first wall; and
   a second wall; wherein
      the first wall and the second wall form the bounds of the channel; and
      at least one of the first wall and the second wall projects above the optical surface;
wherein the optical surface of the first face is protected from scratches and other damage when the lens is set upon a generally flat surface.

3. The lens as described in claim 2, wherein
the second wall is bounded by the first wall; and
an interior side of the second wall forms a beveled edge angled to support a bezel and to separate a front edge of the bezel from the optical surface of the first face.

4. The lens as described in claim 1, wherein
at least a portion of the second face comprises an optical surface; and
the projection projects above the optical surface;
wherein the optical surface of the second face is protected from scratches and other damage when the lens is set upon a generally flat surface.

5. The lens as described in claim 1, wherein
the lens is circular;
the channel is concentric with the center of the lens; and
the projection is concentric with the center of the lens.

6. The lens as described in claim 1, wherein the channel is adapted to support a bezel and to separate an edge of the bezel from the optical surface of the first face.

7. The lens as described in claim 1, wherein
the second wall is bounded by the first wall;
the first face and the second face comprise opposing sides of a lens body; and
at least a portion of the first wall extends beyond a peripheral edge of the lens body.

8. A lens comprising
a first face;
   the first face comprising a first engagement structure extending above the first face and around a peripheral edge of the lens; and
a second face;
   the second face comprising a second engagement structure extending above the second face and around the peripheral edge of the lens;
wherein when at least two lenses are stacked upon each other, the second engagement structure of the second face of a first lens engages the first engagement structure of the first face of a second lens, preventing relative movement between the first lens and the second lens and maintaining a gap between the second face of the first lens and the first face of the second lens.

* * * * *